United States Patent
Zhang et al.

(10) Patent No.: US 9,830,267 B2
(45) Date of Patent: *Nov. 28, 2017

(54) CONTINUOUS PAGE READ FOR MEMORY

(71) Applicant: Micron Technology, Inc., Boise, ID (US)

(72) Inventors: Yihua Zhang, Folsom, CA (US); Jun Shen, Shanghai (CN)

(73) Assignee: MICRON TECHNOLOGY, INC., Boise, ID (US)

( * ) Notice: Subject to any disclaimer, the term of this patent is extended or adjusted under 35 U.S.C. 154(b) by 1 day.

This patent is subject to a terminal disclaimer.

(21) Appl. No.: 14/610,977

(22) Filed: Jan. 30, 2015

(65) Prior Publication Data

US 2015/0149738 A1 May 28, 2015

Related U.S. Application Data

(63) Continuation of application No. 13/202,326, filed as application No. PCT/CN2010/002153 on Dec. 24, 2010, now Pat. No. 8,976,621.

(51) Int. Cl.
*G11C 11/34* (2006.01)
*G11C 16/06* (2006.01)
*G06F 12/0862* (2016.01)
*G11C 16/26* (2006.01)
*G11C 8/04* (2006.01)
*G06F 12/02* (2006.01)
*G11C 7/10* (2006.01)

(52) U.S. Cl.
CPC ...... *G06F 12/0862* (2013.01); *G06F 12/0215* (2013.01); *G11C 7/1039* (2013.01); *G11C 8/04* (2013.01); *G11C 16/26* (2013.01); *G06F 2212/1016* (2013.01); *G06F 2212/2022* (2013.01); *G06F 2212/6022* (2013.01); *G06F 2212/654* (2013.01)

(58) Field of Classification Search
CPC ..... G11C 7/1042; G11C 8/04; G11C 2216/12; G06F 12/0882; G06F 12/0862; G06F 2212/2022; G06F 2212/6022
See application file for complete search history.

(56) References Cited

U.S. PATENT DOCUMENTS

| | | | |
|---|---|---|---|
| 5,305,284 A | 4/1994 | Iwase | |
| 5,768,215 A | 6/1998 | Kwon et al. | |
| 6,614,715 B2 * | 9/2003 | Tsao | G11C 7/1042 365/189.05 |
| 7,180,824 B2 | 2/2007 | Kubo | |

(Continued)

FOREIGN PATENT DOCUMENTS

| | | |
|---|---|---|
| CN | 1368736 A | 9/2002 |
| CN | 1428866 A | 7/2003 |

(Continued)

OTHER PUBLICATIONS

International Search Report dated Oct. 13, 2011 in corresponding International Application No. PCT/CN2010/002153.

(Continued)

*Primary Examiner* — Kretelia Graham
(74) *Attorney, Agent, or Firm* — Holland & Hart LLP

(57) ABSTRACT

Subject matter disclosed herein relates to techniques to read memory in a continuous fashion.

20 Claims, 6 Drawing Sheets

(56) References Cited

U.S. PATENT DOCUMENTS

| | | | |
|---|---|---|---|
| 8,976,621 B2 * | 3/2015 | Zhang | G11C 16/26 365/185.12 |
| 2003/0039142 A1 | 2/2003 | Tsao et al. | |
| 2004/0052124 A1 | 3/2004 | Sudo et al. | |
| 2004/0064649 A1 * | 4/2004 | Volpe | G06F 12/0862 711/137 |
| 2005/0010717 A1 | 1/2005 | Ng et al. | |
| 2006/0018158 A1 | 1/2006 | Jo | |
| 2006/0224789 A1 | 10/2006 | Cho et al. | |
| 2009/0327535 A1 | 12/2009 | Liu | |

FOREIGN PATENT DOCUMENTS

| | | |
|---|---|---|
| CN | 1624800 A | 6/2005 |
| CN | 1841297 | 10/2006 |
| CN | 101782870 | 7/2010 |
| JP | 01-199399 | 8/1989 |
| JP | 02-051782 | 2/1990 |
| JP | 05-028780 | 2/1993 |
| JP | H0845285 A | 2/1996 |
| JP | 2001184874 A | 7/2001 |
| JP | 2001-325796 | 11/2001 |
| JP | 2005-353275 | 12/2005 |
| JP | 2007-080410 | 3/2007 |
| JP | 2009-536424 | 10/2009 |

OTHER PUBLICATIONS

English Translation of Notice of Rejection Ground for Japanese Patent Application No. 2013-544994 dated Apr. 30, 2014.
Extended European Search Report for Application No. 10860986.8 dated May 9, 2014 in 7 pages.
English Translation of Notice of Preliminary Rejection for Korean Patent Application No. 10-2013-7019496 dated Sep. 4, 2014.
Korean Notice of Allowance for Korean Patent Application No. 10-2013-7019496 dated Mar. 26, 2015.

* cited by examiner

CONTINUOUS PAGE READ FOR MEMORY

RELATED APPLICATIONS

This application is a continuation from U.S. patent application Ser. No. 13/202,326, filed on Aug. 18, 2011, incorporated by reference herein, and which was the U.S. National Phase under 35 U.S.C. §371 of Int'l Appl. No. PCT/CN2010/002153, filed on Dec. 24, 2010 and published in English on Jun. 28, 2012 as WO2012/083507 and herein incorporated by reference.

BACKGROUND

Field

Subject matter disclosed herein relates to techniques to read memory in a continuous fashion.

Description of the Related Art

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming operations may be used to store information in such memory devices, while a read operation may be used to retrieve stored information.

BRIEF DESCRIPTION OF THE DRAWINGS

Non-limiting and non-exhaustive embodiments will be described with reference to the following figures, wherein like reference numerals refer to like parts throughout the various figures unless otherwise specified.

DETAILED DESCRIPTION

Figure 1:
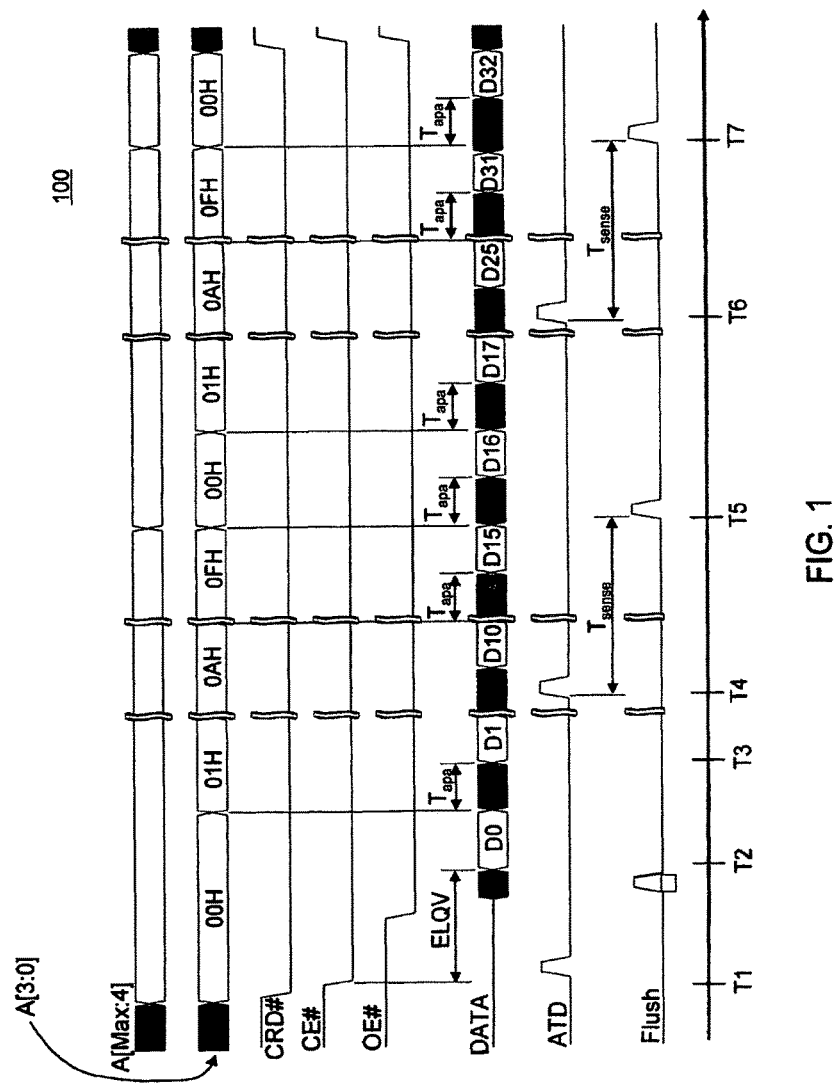
FIG. 1 is a timing diagram of a continuous read process, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture to improve data throughput rate by reading multiple pages of data stored in a memory in an overlapping, continuous fashion. For example, after reading a first page, a second page may be continuously read without an interruption to provide a memory address of the second page. Such a read process may also include reading a portion of the first page while preparing to read a portion of the second page. For example, while reading a portion of the first page, one or more sense amplifiers of memory may be activated to measure states of memory cells included in the second page. In an implementation, such activation of sense amplifiers may comprise an initial portion of a process to read a page.

In an implementation, a page of data may comprise sixteen words, wherein a word of data may comprise sixteen-bits, though claimed subject matter is not so limited. Such a continuous fashion of reading multiple pages of data may lead to relatively fast read operations compared to read operations that do not continuously read multiple pages. One reason for such an improvement of read speed may be attributable to the fact that such a continuous read process need not include a time delay that may otherwise occur after the end of a process to read one page and before the beginning of a process to read a subsequent page. For example, such a time delay may otherwise be used to provide a memory address and/or to allow for time to sense memory cells of a subsequent page of data during a read process. Also, a benefit of such a continuous read process may include a reduction in a number of pins that a burst read technique may use. For example, a continuous read process need not include a CLOCK pin, a WAIT pin, and/or an ADDRESS VALID pin. Even so, such a continuous read process may achieve a similar data throughput as a burst read process.

In an embodiment, a process to read multiple pages of a memory device in an overlapping, continuous fashion may include sensing/reading a page of data and flushing the page of data into a page buffer in response to receiving a first portion of a memory address. A first portion of the memory address may comprise an address of a page of data and an additional portion of the memory address may comprise least significant bits of the memory address to identify words of the page of data. For example, a first portion of a three-byte address may comprise all but four least significant bits (LSBs) of the address. After the page of data is flushed into the page buffer, an additional portion (e.g., LSBs) of the memory address may be provided to the memory device. As a result, a user may begin to fetch words of the page from the page buffer. During such a process of fetching words, the number of words fetched from the page buffer may be counted. If such a count reaches a particular threshold number, a reading process to read a subsequent page of data may commence. Such a particular threshold number, which may be selected for a particular application, may comprise a number less than the threshold number of words of the page of data. Meanwhile, concurrently with reading at least a first portion of the subsequent page of data, remaining words of the first page may continue to be fetched. Such a process to read multiple pages of a memory device may further comprise flushing the subsequent page of data into the page buffer in response to a last word of the page of data being fetched. In an implementation, initiating reading of the subsequent page of data may be performed automatically without receiving an address for the subsequent page of data. For example, a user or an executing application need not provide an address for the subsequent page of data. Of course, such details of a process to read multiple pages are merely examples, and claimed subject matter is not so limited. The first portion of the memory address can correspond to two or more pages.

In another embodiment, a process to read multiple pages of a memory device in an overlapping, continuous fashion may be performed in response to toggling between two states of a bit of a memory address. For example, toggling the LSB of a memory address from a high state to a low state may result in fetching a word of data. Subsequently toggling from a low state to a high state may result in fetching another word of data, and so on. In such a manner, fetching words of data may be performed synchronously with toggling a bit of the memory address. In such an implementation, a process of fetching data may use merely a single address pin of a memory device (e.g., a pin for the LSB of a memory address).

In an embodiment, a process to read multiple pages of a memory device in a continuous fashion may be performed by a memory device comprising a controller to read a page of data and to flush the page of data into a page buffer in response to receiving a first portion of a memory address. In this process, a controller may also fetch words of the page of data stored in the page buffer in response to receiving an additional portion of the memory address. Such a controller may also monitor a count of the words fetched from the page buffer, and in response to the count reaching a particular threshold number, the controller may read a subsequent page of data while continuing to fetch the words. Such a particular threshold number may be less than the number of words in the page of data.

FIG. 1 is a timing diagram of a continuous read process 100, according to an embodiment. In one implementation, such a read process may be applied to a computing system comprising a NOR flash memory, a memory controller, and a processor (see FIG. 6, for example). Other implementations may involve other types of memory, such as NAND, PCM, and so on. For example, a processor, in response to executing an application, may provide a read command that includes a memory address identifying a physical location where data is to be read. Such an address may comprise a multiword-wide parallel signal. In one implementation, data read from a NOR flash memory may be loaded to a page buffer before being sent to a processor (e.g., a user). Of course, such details of a computing are merely examples, and claimed subject matter is not so limited.

In one implementation, a read process 100 may involve 24-bit addressing and pages that comprise sixteen words. Accordingly, such words of a particular page may be individually identified by a 4-bit address or a 4-bit LSB portion of the 24-bit address, for example. Notation "A[Max:4]" in FIG. 1 means a portion of a memory address comprising multiple bits from a most significant bit (MSB) to the fourth bit from the LSB. Similarly, A[3:0] describes a portion of a memory address comprising four bits from the fourth bit from the LSB to the LSB. Of course, such details regarding sizes of addresses are merely examples, and claimed subject matter is not limited to any particular size.

Returning to FIG. 1, at time T1, a MSB portion of address A[Max:4] may be provided to a memory device. Also at time T1, waveform CRD# may transition to a logic low to direct the memory device to enter a continuous read mode. A chip enable signal CE# may also transition to a logic low. Also at time T1, a sense process to read a page of data from the memory device may be indicated by a pulse in waveform ATD. As explained above, such a page of data may be identified by MSB portion of address A[Max:4]. A sense process may include activation of one or more sense amplifiers to sense logic levels of individual memory cells of a page of a memory array of a memory device. For example, in an implementation, sense amplifiers may be activated by an event such as an address transaction detection (ATD) pulse generated by ATD circuitry in the memory device. Such ATD circuitry may generate an ATD pulse in response to detecting a transition of MSB addresses, for example. Upon completing such a sense process, a read page of data may be loaded into a page buffer (e.g., in a flush process) sometime during a time span ELQV (e.g., CE# Low to DQ Valid). Individual bytes or words of the page of data stored in the page buffer may then be retrieved by a user, processor, or any such entity that issued a read command to read from the memory device. Meanwhile, a LSB portion A[3:0] of a memory address comprising four bits may be provided to the memory device. At time T2, a first word D0 of the page of data may be retrieved by a memory controller, for example, from the page buffer. At time T3, a second word D1 of the page of data may be retrieved by the memory controller from the page buffer in response to receiving a new memory address A[3:0]. For example, the new memory address may comprise the value 01H corresponding to word D1 stored at the location 01H of the current page. During a time span $T_{apa}$, a memory controller of the memory device may decode A[3:0] to retrieve a subsequent word, such as D1 for example, from the page buffer and place the subsequent word on a data bus. Subsequent words of the page of data may be similarly retrieved from the page buffer in response to receiving subsequent addresses A[3:0] (e.g., 02H, 03H, 04H, . . . ). In an implementation, the number of data words retrieved from the data buffer may be counted. After reaching a particular threshold count, such as at time T4, a process to read a subsequent page of data (e.g., comprising words D16 through D31) may commence while continuing to fetch remaining words of the first page from the page buffer. In detail, referring to the DATA waveform in FIG. 1, after reaching a particular threshold count at word D9, such as at time T4, a process to read the subsequent page of data may commence while continuing to fetch remaining words D10 through D15 of the first page from the page buffer. Accordingly, such a process to commence reading a subsequent page of data may occur upon retrieving a particular number of words from the data buffer, wherein the particular number is less than the number of words in the page of data. Waveform ATD may include a pulse at time T4 to begin a sense process to read the subsequent page of data. Such a sense process may occur within a time span $T_{sense}$. Upon completion of the sense process, and after completing a process of retrieving or fetching words of the first page from the page buffer, such as at time T5, the newly read second page of data may be loaded into the page buffer, indicated by a pulse in waveform Flush at time T5. In one implementation, a process of retrieving or fetching words of a page may be completed if all words of the page have been fetched. Such a process of concurrently reading a portion of a first page and a portion of a subsequent page may provide a benefit of improving read speed. Such a process may also comprise a continuous read process to read the first and subsequent pages.

As for the first page of data, described above, subsequent words of the second or subsequent page of data may be similarly retrieved from the page buffer in response to receiving subsequent addresses A[3:0] (e.g., 01H, 02H, 03H, . . . ). After reaching a particular count, such as at time T6, a process to read a third page of data (e.g., comprising words D32 through D47) may commence while continuing to fetch remaining words of the second page from the page buffer. In detail, referring to the DATA waveform in FIG. 1, after reaching a particular count at word D24, such as at time T6, a process to read the third page of data may commence while continuing to fetch remaining words D25 through D31 of the second page from the page buffer. Accordingly, such a process to commence reading a subsequent page of data may occur upon retrieving a particular threshold number of words from the data buffer. Waveform ATD may include a pulse at time T6 to begin a sense process to read the third page of data. Such a sense process may occur within a time span $T_{sense}$ (e.g., from time T6 to time T7). Upon completion of the sense process, and after completing a process of retrieving or fetching words of the second page from the page buffer, such as at time T7, the newly read third page of data may be loaded into the page buffer, indicated by a pulse in waveform Flush at time T7. Such a process of concurrently reading a portion of the second page and a portion of the third page may provide a benefit of improving read speed, as mentioned above. Such a process may also comprise a continuous read process to read the second and third pages. Such a process may continue in similar fashion as described above for subsequent pages of data. Of course, such details of process 100 are merely examples, and claimed subject matter is not limited in this respect.

Figure 2:
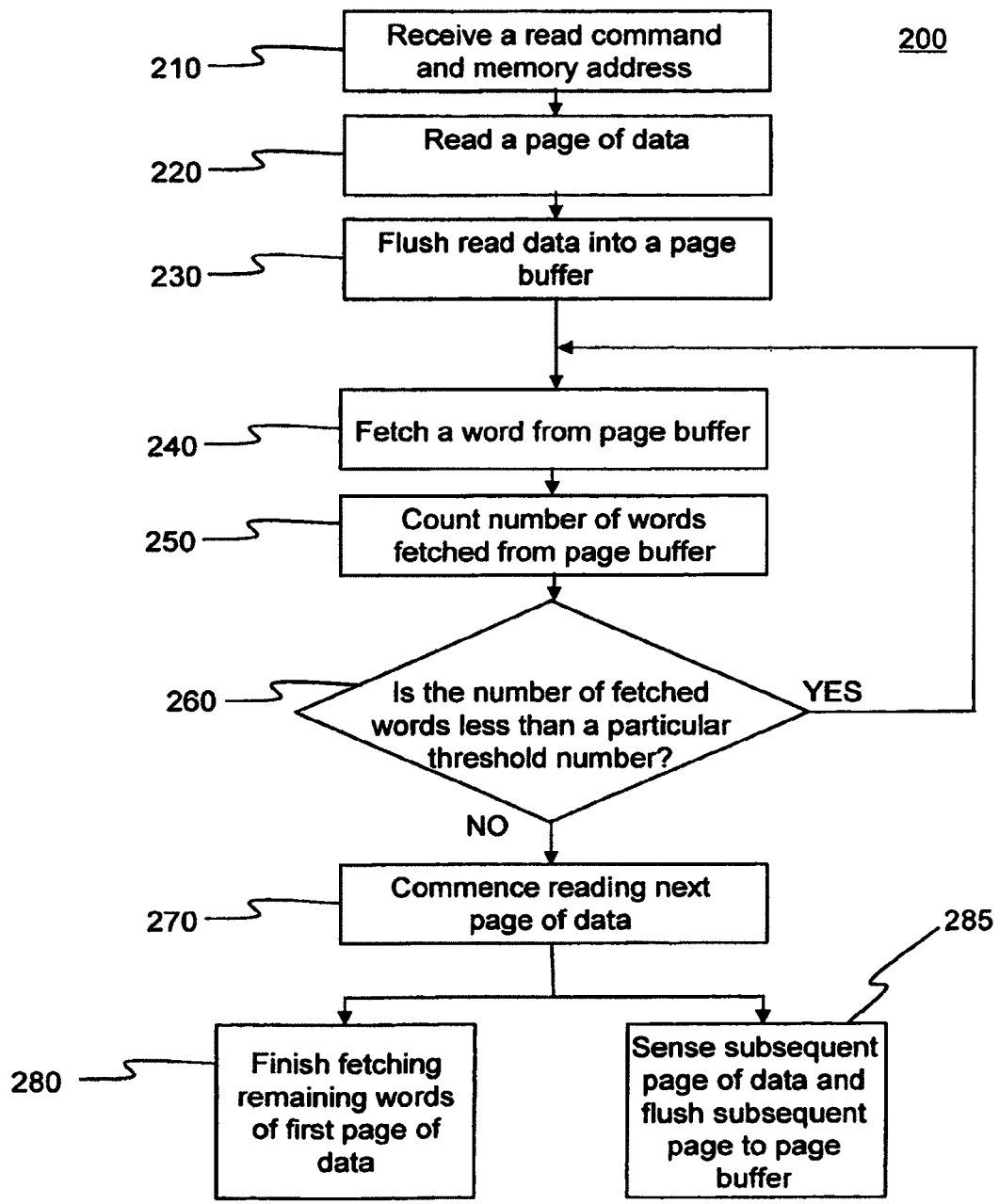
FIG. 2 is a flow diagram of a continuous read process, according to an embodiment.

FIG. 2 is a flow diagram of a continuous read process 200, according to an embodiment. Such a read process may be similar to that described by the timing diagram in FIG. 1, for example. At block 210, a read command including a memory address may be provided to a memory device. Such a read command may be initiated, for example, by a processor executing an application, though claimed subject matter is not so limited. In one implementation, such a read command and memory address may be received by the memory device on a parallel bus. In another implementation, such a read command and memory address may be serially received by the memory device. In either implementation, at block 220, the memory device may read a page of data identified by at least a portion of the memory address comprising MSBs. In contrast, for example, LSBs of the memory address may be descriptive of individual words and/or bytes of data of a page. A process of reading a page of data may comprise a sense process including activation of one or more sense amplifiers to sense logic levels of individual memory cells of the page of a memory array of the memory device. At block 230, upon completing such a sense process, a read page of data may be loaded or flushed into a page buffer. At block 240, individual words of the page of data stored in the page buffer may then be retrieved by a user, processor, or any such entity that issued a read command to read from the memory device, for example. At block 250, the number of fetched words may be monitored or counted. At diamond 260, the number of words fetched so far may be compared with a particular threshold number less than the number of words in the page. For example, such a particular threshold number may equal 12, wherein the number of words in a page may equal 16. If the number of fetched words is less than a particular threshold number, then process 200 may return to block 240 to fetch another word. However, if the number of fetched words is not less than a particular threshold number, then process 200 may proceed to block 270 to begin a process to read a subsequent page of data. At block 285, the subsequent page of data may be read by a sensing process, as described above. Upon completion of a sensing process, the subsequent page may be flushed to the page buffer. Meanwhile, concurrent to processes described at block 285, remaining words of the first page may be fetched from the page buffer. Accordingly, such a process to commence reading a subsequent page of data may occur upon retrieving a particular number of words from the data buffer. In addition, such a process may comprise a continuous read process to read subsequent pages without time delay and/or without providing a new page address for subsequent pages. Of course, such details of process 200 are merely examples, and claimed subject matter is not limited in this respect.

Figure 3:
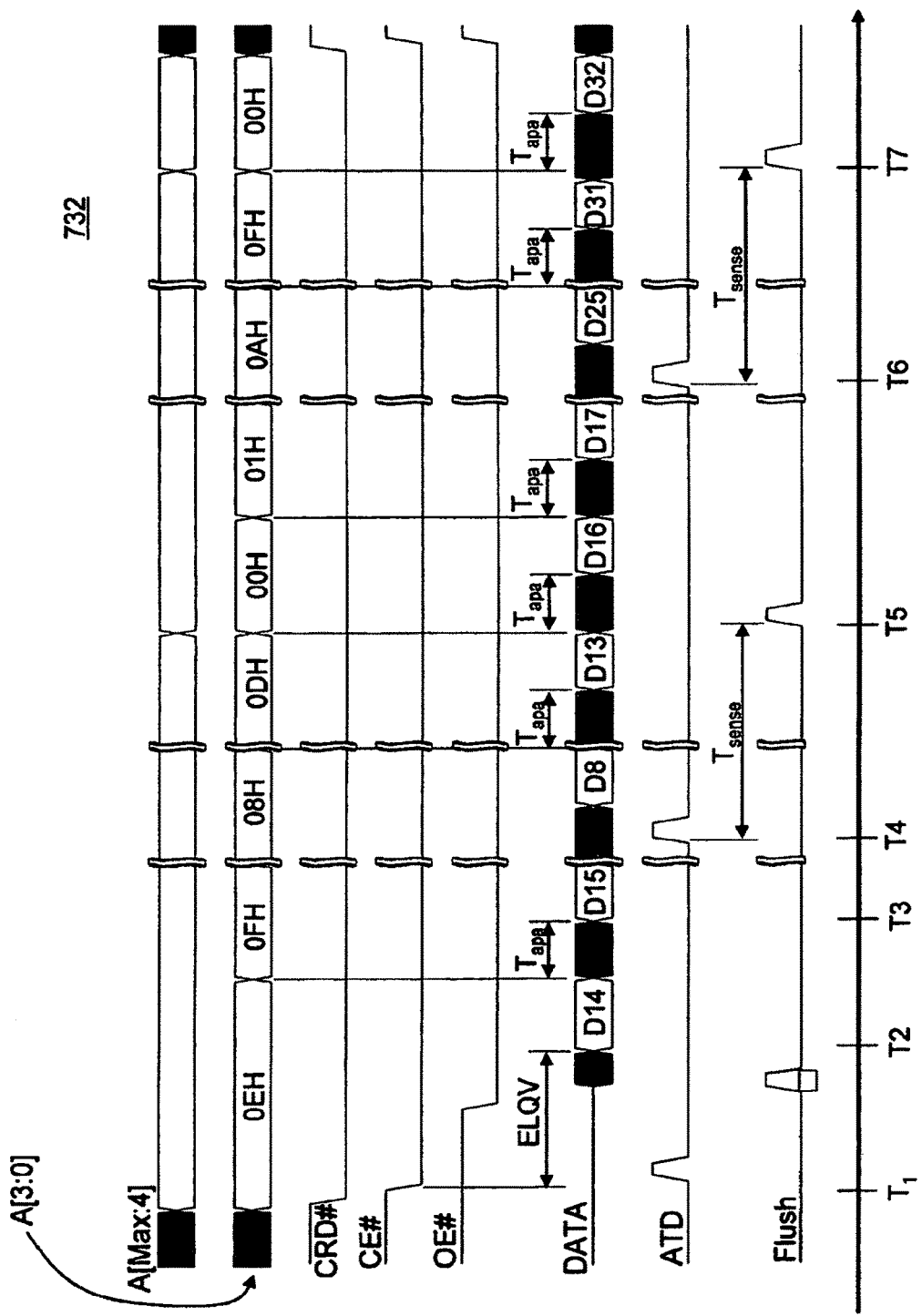
FIG. 3 is a timing diagram of a continuous read process, according to another embodiment.

FIG. 3 is a timing diagram of a particular continuous read process 300, according to an embodiment. Such a process may be similar to process 100 or 200 described above, except that process 300 begins at a misaligned start address as follows. Such a misaligned start address may comprise a word address not equal to 00H, which may represent a first word in a page of data (see, for example, process 100, where a first word D0 is represented by address 00H). In such a case, in a particular embodiment, all words of a page may nevertheless be fetched from a page buffer before a subsequent page of data may be read. Such a fetching process, however, need not be performed sequentially with respect to an order that such words are stored in a page of a memory array and/or a page buffer. For example, in FIG. 3, a misaligned start address is equal to 0EH, which may represent word D14. D15 represented by word address 0FH may be fetched next. Upon reaching an upper value of a word address (e.g., 0FH), a word address may next begin at word address 00H so that word D0 is fetched next. Following word addresses may sequentially comprise values 01H, 02H, 03H, 0DH representing D1, D2, D3, . . . , D13, respectively. Thus, all sixteen words may be fetched, though claimed subject matter is not limited to any particular fetch order.

In Detail, read process 300 may involve 24-bit addressing and pages that comprise sixteen words. Accordingly, such words of a particular page may be individually identified by a 4-bit address or a 4-bit LSB portion of the 24-bit address, for example. Of course, such details regarding sizes of addresses are merely examples, and claimed subject matter is not limited to any particular size. At time T1, a MSB portion of address A[Max:4] may be provided to a memory device. Also at time T1, a sense process to read a page of data from the memory device may be indicated by a pulse in waveform ATD. As explained above, such a page of data may be identified by MSB portion of address A[Max:4]. A sense process may include activation of one or more sense amplifiers to sense logic levels of individual memory cells of a page of a memory array of a memory device. Upon completing such a sense process, a read page of data may be flushed to a page buffer sometime during a time span ELQV. Individual bytes or words of the page of data stored in the page buffer may then be retrieved by a user, processor, or any such entity that issued a read command to read from the memory device. Meanwhile, a LSB portion A[3:0] of a memory address comprising four bits may be provided to the memory device. As pointed out above, such a memory address need not begin with a particular memory location (e.g., 00H). For example, at time T2, a first word D14 of the page of data may be retrieved from the page buffer. At time T3, a second word D15 of the page of data may be retrieved from the page buffer in response to receiving a new memory address A[3:0]. For example, the new memory address may comprise the value 0FH corresponding to word D15 stored at the location 0FH of the current page. Subsequent words of the page of data may be similarly retrieved from the page buffer in response to receiving subsequent addresses A[3:0] (e.g., 00H, 01H, 02H, . . . ). In an implementation, the number of data words retrieved from the data buffer may be counted. After reaching a particular threshold count, such as at time T4, a process to read a subsequent page of data (e.g., comprising words D16 through D31) may commence while continuing to fetch remaining words of the first page from the page buffer. In detail, referring to the DATA waveform in FIG. 3, after reaching a particular threshold count at word D7, such as at time T4, a process to read the subsequent page of data may commence while continuing to fetch remaining words D8 through D13 of the first page from the page buffer. Accordingly, such a process to commence reading a subsequent page of data may occur upon retrieving a particular threshold number of words from the data buffer, wherein the particular threshold number is less than the number of words in the page of data. Waveform ATD may include a pulse at time T4 to begin a sense process to read the subsequent page of data. Such a sense process may occur within a time span $T_{sense}$. Upon completion of the sense process, and after completing a process of retrieving or fetching words of the first page from the page buffer, such as at time T5, the newly read second page of data may be loaded into the page buffer, indicated by a pulse in waveform Flush at time T5. Though the first page of data may have been fetched beginning in the middle of a range of addresses for the first page, the next page of data may be fetched beginning with address 00H. For example, subsequent words of the second or subsequent page of data may be retrieved from the page buffer in response to receiving addresses A[3:0] (e.g., 01H, 02H, 03H, . . . ). As in the case of the first page of data, after reaching a particular count, such as at time T6, a process to read a third page of data (e.g., comprising words D32 through D47) may commence while continuing to fetch remaining words of the second page from the page buffer, as explained above. In detail, referring to the DATA waveform in FIG. 3, after reaching a particular count at word D24, such as at time T6, a process to read the third page of data may commence while continuing to fetch remaining words D25 through D31 of the second page from the page buffer. Accordingly, such a process to commence reading a subsequent page of data may occur upon retrieving a particular number of words from the data buffer. Waveform ATD may include a pulse at time T6 to begin a sense process to read the third page of data. Such a sense process may occur within a time span $T_{sense}$ (e.g., from time T6 to time T7). Upon completion of the sense process, and after completing a process of retrieving or fetching words of the second page from the page buffer, such as at time T7, the newly read third page of data may be loaded into the page buffer, indicated by a pulse in waveform Flush at time T7. Such a process may continue in similar fashion as described above for subsequent pages of data. Of course, such details of process 300 are merely examples, and claimed subject matter is not limited in this respect.

Figure 4:
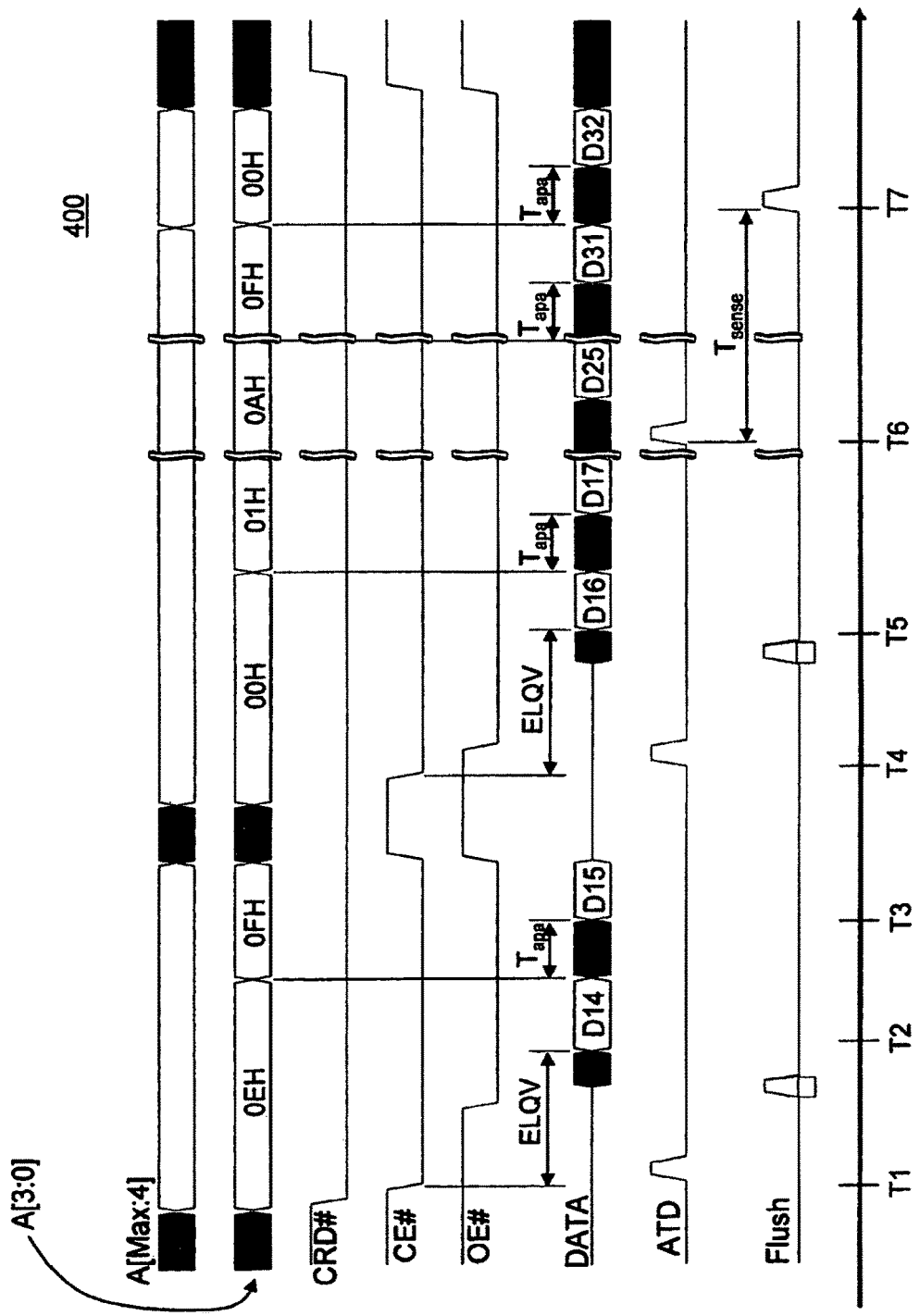
FIG. 4 is a timing diagram of a continuous read process, according to yet another embodiment.

FIG. 4 is a timing diagram of a particular continuous read process 400, according to an embodiment. Such a process may be similar to process 100 or 200 described above, except that process 400, like process 300, begins at a misaligned start address as follows. As explained above, such a misaligned start address may comprise a word address not equal to 00H, which may represent a first word in a page of data (see, for example, process 100, where a first word D0 is represented by address 00H). In such a case, in contrast to process 300, a process of reading an initial page starting with a misaligned start address may comprise truncating the initial page and beginning a process of reading a subsequent page starting with an aligned address (e.g., beginning with word address 00H). In Detail, at time T1, a MSB portion of address A[Max:4] may be provided to a memory device. Also at time T1, a sense process to read a page of data from the memory device may be indicated by a pulse in waveform ATD. As explained above, such a page of data may be identified by MSB portion of address A[Max:4]. A sense process may include activation of one or more sense amplifiers to sense logic levels of individual memory cells of a page of a memory array of a memory device. Upon completing such a sense process, a read page of data may be flushed to a page buffer sometime during a time span ELQV. Individual bytes or words of the page of data stored in the page buffer may then be retrieved by a user, processor, or any such entity that issued a read command to read from the memory device. Meanwhile, a LSB portion A[3:0] of a memory address comprising four bits may be provided to the memory device. As pointed out above, such a memory address need not begin with a particular memory location (e.g., 00H). For example, at time T2, a first word D14 of the page of data may be retrieved from the page buffer. At time T3, a second word D15 of the page of data may be retrieved from the page buffer in response to receiving a new memory address A[3:0]. For example, the new memory address may comprise the value 0FH corresponding to word D15 stored at the location 0FH of the current page. However, instead of retrieving subsequent words of the page of data from the page buffer, process 400 may be re-initialized at time T4, thus truncating the first page of data. In one implementation, such truncated data may not be read, though such data may remain during a subsequent flush to a page buffer. A process to read a subsequent page of data (e.g., comprising words D16 through D31) may commence by sensing and flushing the subsequent page into a page buffer during time span ELQV starting at time T4. At time T5, word D16 may be fetched, as well as subsequent words D17, D18, and so on. After reaching a particular fetch count, such as at time T6, a process to read a third page of data (e.g., comprising words D32 through D47) may commence while continuing to fetch remaining words of the second page from the page buffer, as explained above. In detail, referring to the DATA waveform in FIG. 4, after reaching a particular count at word D24, such as at time T6, a process to read the third page of data may commence while continuing to fetch remaining words D25 through D31 of the second page from the page buffer. Accordingly, such a process to commence reading a subsequent page of data may occur upon retrieving a particular number of words from the data buffer. Waveform ATD may include a pulse at time T6 to begin a sense process to read the third page of data. Such a sense process may occur within a time span $T_{sense}$ (e.g., from time T6 to time T7). Upon completion of the sense process, and after completing a process of retrieving fetching words of the second page from the page buffer, such as at time T7, the newly read third page of data may be loaded into the page buffer, indicated by a pulse in waveform Flush at time T7. Such a process may continue in similar fashion as described above for subsequent pages of data. Of course, such details of process 400 are merely examples, and claimed subject matter is not limited in this respect.

Figure 5:
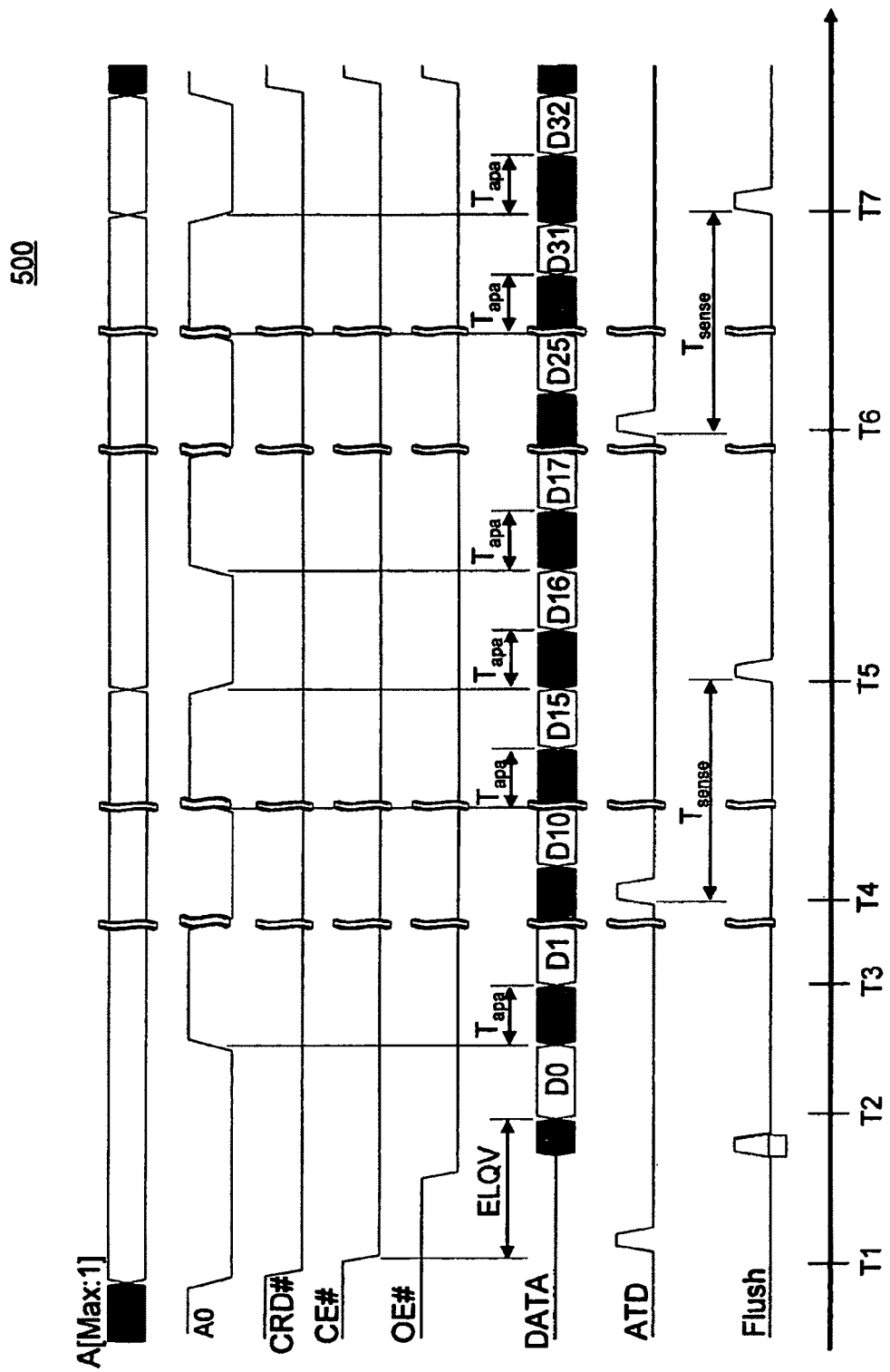
FIG. 5 is a timing diagram of a continuous read process, according to still another embodiment.

FIG. 5 is a timing diagram of a particular continuous read process 500, according to another embodiment. To illustrate a particular example, read process 500 may involve 24-bit addressing and pages that comprise sixteen words. Accordingly, such words of a particular page may be individually identified by a 4-bit address or a 4-bit LSB portion of the 24-bit address, for example. Notation "A[Max:1]" in FIG. 5 means a portion of a memory address comprising all bits except the LSB. Accordingly, A0 describes the LSB of the memory address. Of course, such details regarding sizes of addresses are merely examples, and claimed subject matter is not limited to any particular size.

Process 500 may be similar to process 100 except regarding a process to fetch bytes or words of a page. In detail, process 100 includes fetching words D0, D1, D2, and so on by incrementing and/or updating word address A[3:0]. In contrast, process 500 includes fetching words D0, D1, D2, and so on by toggling the LSB of the memory address A0. Thus, for example, as A0 transitions from one logic level to another logic level (e.g., from 1 to 0 or from 0 to 1), subsequent words may be fetched from a page buffer.

Returning to FIG. 5, at time T1, a MSB portion of address A[Max:1] may be provided to a memory device. Also at time T1, waveform CRD# may transition to a logic low to indicate to the memory device to enter a continuous read mode. A chip enable signal CE# may also transition to a logic low. Also at time T1, a sense process to read a page of data from the memory device may be indicated by a pulse in waveform ATD. As explained above, such a page of data may be identified by MSB portion of address A[Max:1]. A sense process may include activation of one or more sense amplifiers to sense logic levels of individual memory cells of a page of a memory array of a memory device. Upon completing such a sense process, a read page of data may be loaded into a page buffer (e.g., a flush process) sometime during a time span ELQV. Individual bytes or words of the page of data stored in the page buffer may then be retrieved by a user, processor, or any such entity that issued a read command to read from the memory device. Meanwhile, a LSB A0 of the memory address may be provided to the memory device. At time T2, a first word D0 of the page of data may be retrieved from the page buffer. At time T3, a second word D1 of the page of data may be retrieved from the page buffer in response to toggling or transitioning the LSB A0 of the memory address. Subsequent words of the page of data may be similarly retrieved from the page buffer in response to toggling A0. Remaining description of process 500 may be similar to that of process 100. For example, the number of data words retrieved from the data buffer may be counted. After reaching a particular count, such as at time T4, a process to read a subsequent page of data (e.g., comprising words D16 through D31) may commence while continuing to fetch remaining words of the first page from the page buffer. Waveform ATD may include a pulse at time T4 to begin a sense process to read the subsequent page of data. Such a sense process may occur within a time span $T_{sense}$. Upon completion of the sense process, and after completing a process of retrieving or fetching words of the first page from the page buffer, such as at time T5, the newly read second page of data may be loaded into the page buffer, indicated by a pulse in waveform Flush at time T5.

As for the first page of data, described above, subsequent words of the second or subsequent page of data may be similarly retrieved from the page buffer in response to toggling A0. After reaching a particular count, such as at time T6, a process to read a third page of data (e.g., comprising words D32 through D47) may commence while continuing to fetch remaining words of the second page from the page buffer. In detail, referring to the DATA waveform in FIG. 5, after reaching a particular count at word D24, such as at time T6, a process to read the third page of data may commence while continuing to toggle A0 and fetch remaining words D25 through D31 of the second page from the page buffer. Accordingly, such a process to commence reading a subsequent page of data may occur upon retrieving a particular number of words from the data buffer. Waveform ATD may include a pulse at time T6 to begin a sense process to read the third page of data. Such a sense process may occur within a time span $T_{sense}$ (e.g., from time T6 to time T7). Upon completion of the sense process, and after completing a process of retrieving or fetching words of the second page from the page buffer, such as at time T7, the newly read third page of data may be loaded into the page buffer, indicated by a pulse in waveform Flush at time T7. Such a process of concurrently reading a portion of the second page and a portion of the third page may provide a benefit of improving read speed, as mentioned above. Such a process may also comprise a continuous read process to read the second and third pages. Such a process may continue in similar fashion as described above for subsequent pages of data. Of course, such details of process 500 are merely examples, and claimed subject matter is not limited in this respect.

Figure 6:
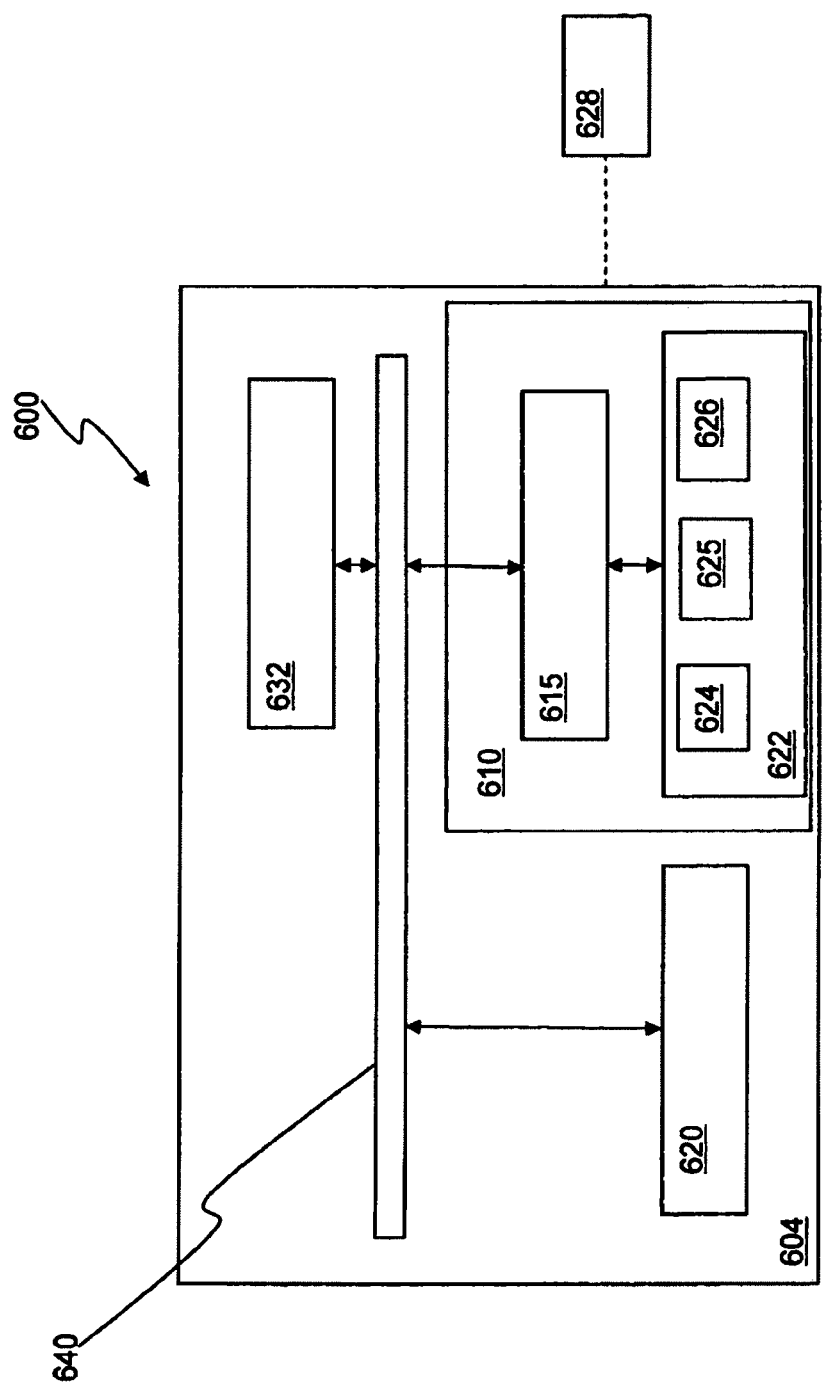
FIG. 6 is a schematic diagram illustrating an exemplary embodiment of a computing system.

FIG. 6 is a schematic diagram illustrating an exemplary embodiment of a computing system 600 including a memory device 610. Such a computing device may comprise one or more processors, for example, to execute an application and/or other code. For example, memory device 610 may comprise a nonvolatile memory or a data buffer such as data buffer 130, shown in FIG. 1. A computing device 604 may be representative of any device, appliance, or machine that may be configurable to manage memory device 610. Memory device 610 may include a memory controller 615 and a memory 622. By way of example but not limitation, computing device 604 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 600, and the processes and methods as further described herein, may be implemented using or otherwise including hardware, firmware, software, or any combination thereof. Thus, by way of example but not limitation, computing device 604 may include at least one processing unit 620 that is operatively coupled to memory 622 through a bus 640 and a host or memory controller 615. Processing unit 620 is representative of one or more circuits configurable to perform at least a portion of a data computing procedure or process. By way of example but not limitation, processing unit 620 may include one or more processors, controllers, microprocessors, microcontrollers, application specific integrated circuits, digital signal processors, programmable logic devices, field programmable gate arrays, and the like, or any combination thereof. Processing unit 620 may include an operating system configured to communicate with memory controller 615. Such an operating system may, for example, generate commands to be sent to memory controller 615 over bus 640. In one implementation, in response to a read command, for example, memory controller 615 may read a page of data and flush the page of data into a page buffer 625 in response to receiving a first portion of a memory address via bus 640. Words of the page of data stored in page buffer 625 may then be fetched in response to receiving an additional portion of the memory address. Memory controller 615 may count words fetched from the page buffer. In response to the counted words reaching a particular number, which is less than the number of words of the page, the memory controller may begin to read a subsequent page while continuing to fetch the words of the first page. Of course, such an implementation is merely an example, and claimed subject matter is not so limited. For example, in another implementation, data buffer 625 need not be included in computing system 600 since a page buffer may be included inside memory 622. In a particular example, such a memory may determine if its page buffer is to be flushed based, at least in part, on whether 16 data words have been fetched. Also, memory controller 615, in one implementation, need not count fetched data since a continuous page read protocol may set forth that once a memory controller fetches 16 words, the memory may resultantly flush the page buffer as the subsequent page is sensed by the memory. In this way, the memory itself may count data that has been fetched by the memory controller in order to ensure that the memory has enough time to perform a subsequent sensing process. Again, such details are merely examples, and claimed subject matter is not so limited.

Memory 622 is representative of any data storage mechanism. Memory 622 may include, for example, a primary memory 624 and/or a secondary memory 626. Primary memory 624 may include, for example, a random access memory, read only memory, etc. While illustrated in this example as being separate from processing unit 620, it should be understood that all or part of primary memory 624 may be provided within or otherwise co-located/coupled with processing unit 620.

Secondary memory 626 may include, for example, the same or similar type of memory as primary memory and/or one or more data storage devices or systems, such as, for example, a disk drive, an optical disc drive, a tape drive, a solid state memory drive, etc. In certain implementations, secondary memory 626 may be operatively receptive of, or otherwise configurable to couple to, a computer-readable medium 628. Computer-readable medium 628 may include, for example, any medium that can carry and/or make accessible data, code, and/or instructions for one or more of the devices in system 600.

Computing device 604 may include, for example, an input/output 632. Input/output 632 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 632 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
    reading a first page of data and providing said first page of data to be stored in a page buffer in response to receiving a first portion of a memory address of said first page;
    receiving an additional portion of said memory address of said first page after storing said first page of data in said page buffer, wherein said additional portion of said memory address identifies words of said first page of data;
    fetching said words of said first page of data stored in said page buffer in response to said receiving said additional portion of said memory address of said first page;
    monitoring a count of said words fetched from said page buffer; and
    sensing a second page of data before completing said fetching words of said first page based at least in part on said monitoring said count of said words.

2. The method of claim 1, further comprising:
    providing said second page of data to said page buffer in response to a last word of said first page of data being fetched.

3. The method of claim 1, wherein initiating said sensing of said second page of data is performed automatically without receiving an address for said second page of data.

4. The method of claim 1, wherein said first portion of said memory address comprises an address of said first page of data and said additional portion of said memory address comprises least significant bits of said memory address to identify said words of said first page of data.

5. The method of claim 1, wherein said fetching words of said first page is performed synchronously with changing a value of said additional portion of said memory address.

6. The method of claim 1, wherein said first portion of said memory address corresponds to two or more pages.

7. A method comprising:
    reading a first page of data and providing said first page of data to be stored in a page buffer in response to receiving a first portion of a memory address of said first page;
    receiving an additional portion of said memory address of said first page after storing said first page of data in said page buffer;
    fetching words of said first page of data stored in said page buffer in response to said receiving said additional portion of said memory address of said first page;
    sensing a second page of data before completing said fetching words of said first page;
    monitoring a count of said words fetched from said page buffer; and
    in response to said count reaching a particular threshold number less than a number of said words of said first page of data, sensing said second page of data while continuing to fetch said words.

8. A method comprising:
    reading a first page of data and providing said first page of data to be stored in a page buffer in response to receiving a first portion of a memory address of said first page;
    receiving an additional portion of said memory address of said first page after storing said first page of data in said page buffer;
    fetching words of said first page of data stored in said page buffer in response to said receiving said additional portion of said memory address of said first page;
    sensing a second page of data before completing said fetching words of said first page; and
    toggling said additional portion of said memory address between two values, wherein said fetching said words of said first page of data is performed synchronously with said toggling, and wherein said additional portion of said memory address comprises a single bit of said memory address.

9. A memory device comprising:
a controller to:
read a page of data and provide said page of data to be stored in a page buffer in response to receiving a first portion of a memory address of said page of data;
receive an additional portion of said memory address of said page of data after storing said page of data in said page buffer, wherein said additional portion of said memory address identifies words of said page of data;
fetch said words of said page of data stored in said page buffer in response to said additional portion of said memory address;
monitor a count of said words fetched from said page buffer; and
sense a subsequent page of data before completing said fetching words of said page of data based at least in part on said monitoring said count of said words.

10. The memory device of claim 9, wherein said controller is further adapted to:
in response to said count reaching a particular threshold number less than a number of said words of said page of data, read said subsequent page of data while continuing to fetch said words, wherein sensing said subsequent page of data comprises reading said subsequent page of data.

11. The memory device of claim 9, wherein said controller is adapted to flush said subsequent page of data into said page buffer in response to a last word of said page of data being fetched.

12. The memory device of claim 9, wherein said controller is adapted to initiate said sense of said subsequent page of data automatically without receiving an address for said subsequent page of data.

13. The memory device of claim 9, wherein said first portion of said memory address comprises an address of said page of data and said additional portion of said memory address comprises least significant bits of said memory address to identify said words of said page of data.

14. The memory device of claim 9, wherein said controller is adapted to toggle said additional portion of said memory address between two values, wherein said fetching said words of said page of data is performed synchronously with said toggling, and wherein said additional portion of said memory address comprises a single bit of said memory address.

15. The memory device of claim 9, wherein said fetching words of said page is performed synchronously with changing a value of said additional portion of said memory address.

16. The memory device of claim 9, wherein said first portion of said memory address corresponds to two or more pages.

17. A system comprising:
a memory device comprising an array of memory cells, said memory device further comprising a controller to:
read a page of data and flush said page of data to be stored in a page buffer in response to receiving a first portion of a memory address of said page of data;
receive an additional portion of said memory address of said page of data after storing said page of data in said page buffer, wherein said additional portion of said memory address identifies words of said page of data;
fetch said words of said page of data stored in said page buffer in response to said additional portion of said memory address;
monitor a count of said words fetched from said page buffer; and
sense a subsequent page of data before completing said fetching words of said first page based at least in part on said monitoring said count of said words; and
a processor to host one or more applications and to initiate a write command to said controller to provide access to said memory cells.

18. The system of claim 17, wherein said controller is adapted to:
in response to said count reaching a particular threshold number less than a number of said words of said page of data, read a subsequent page of data while continuing to fetch said words, wherein sensing said subsequent page of data comprises reading said subsequent page of data.

19. The system of claim 17, wherein said controller is adapted to initiate said sense of said subsequent page of data automatically without receiving an address for said subsequent page of data.

20. The system of claim 17, wherein said first portion of said memory address comprises an address of said page of data and said additional portion of said memory address comprises least significant bits of said memory address to identify said words of said page of data.

* * * * *